United States Patent
Ohta

(10) Patent No.: US 9,692,353 B2
(45) Date of Patent: Jun. 27, 2017

(54) SOLAR CELL SYSTEM AND SOLAR CELL MODULE

(71) Applicant: Panasonic Intellectual Property Management Co., Ltd., Osaka (JP)

(72) Inventor: Kazuki Ohta, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/132,250

(22) Filed: Apr. 19, 2016

(65) Prior Publication Data

US 2016/0233826 A1    Aug. 11, 2016

Related U.S. Application Data

(63) Continuation of application No. PCT/JP2014/077329, filed on Oct. 14, 2014.

(30) Foreign Application Priority Data

Nov. 8, 2013  (JP) ................. 2013-232046

(51) Int. Cl.
  *H02S 40/22* (2014.01)
  *H01L 31/042* (2014.01)
  *H02S 30/10* (2014.01)

(52) U.S. Cl.
  CPC ............ *H02S 40/22* (2014.12); *H01L 31/042* (2013.01); *H02S 30/10* (2014.12); *Y02E 10/52* (2013.01)

(58) Field of Classification Search
  CPC ......... H02S 40/22; H02S 30/10; H01L 31/042
  USPC ....................................................... 136/244
  See application file for complete search history.

(56) References Cited

U.S. PATENT DOCUMENTS

| 7,952,016 B2 | 5/2011 | Higuchi et al. |
| 2007/0056625 A1 | 3/2007 | Higuchi et al. |
| 2011/0192449 A1 | 8/2011 | Higuchi et al. |

FOREIGN PATENT DOCUMENTS

| JP | S56-78176 A | 6/1981 |
| JP | H11-307793 A | 11/1999 |
| JP | H11-340491 A | 12/1999 |
| JP | 2002-111035 A | 4/2002 |
| JP | 2002-222981 | * 8/2002 |
| JP | 2002-222981 A | 8/2002 |
| JP | 2007-81034 A | 3/2007 |

OTHER PUBLICATIONS

International Search Report issued for the international application No. PCT/JP2014/077329 on Nov. 11, 2014.

* cited by examiner

*Primary Examiner* — Jayne Mershon
(74) *Attorney, Agent, or Firm* — Mots Law, PLLC

(57) ABSTRACT

A solar cell system includes a bifacial solar cell module which is to be installed tilted relative to a horizontal plane with one edge in an upper position and another edge in a lower position, the solar cell module including: a solar panel which has a solar cell array region in which a plurality of solar cells are disposed; and a frame which includes portions surrounding a periphery of the solar panel, wherein the solar cell array region is formed in such a manner that a first distance between the solar cell array region and the portion of the frame along the other edge of the solar cell module is greater than a second distance between the solar cell array region and the portion of the frame along the one edge of the solar cell module.

14 Claims, 3 Drawing Sheets

SOLAR CELL SYSTEM AND SOLAR CELL MODULE

CROSS REFERENCE TO RELATED APPLICATION

This is a continuation application of PCT International Application No. PCT/JP2014/077329 filed on Oct. 14, 2014, designating the United States of America, which is based on and claims priority of Japanese Patent Application No. 2013-232046 filed on Nov. 8, 2013. The entire disclosures of the above-identified applications, including the specifications, drawings and claims are incorporated herein by reference in their entirety.

FIELD

The present disclosure relates to a solar cell system and a solar cell module.

BACKGROUND

A bifacial solar cell module has been known (Patent Literature 1). In a solar cell system in which such a bifacial solar cell module is used, the solar cell module may be installed tilted relative to a horizontal plane, with one edge up and the other edge down.

CITATION LIST

Patent Literature

[PTL 1] Japanese Unexamined Patent Application Publication No. 2007-81034

SUMMARY

Technical Problem

It is important for the above solar cell system to receive a great amount of light also on the back side of the solar cell module.

An object of the present disclosure is to provide a solar cell system and a solar cell module which cause a great amount of light which has passed through a solar cell module from a light-receiving side to again enter the solar cell module from the back side.

Solution to Problem

A solar cell system according to the present disclosure is a solar cell system including a bifacial solar cell module which is to be installed tilted relative to a horizontal plane with one edge in an upper position and another edge in a lower position, the solar cell module including: a solar panel which has a solar cell array region in which a plurality of solar cells are disposed; and a frame surrounding a periphery of the solar panel, wherein the solar cell array region is formed in such a manner that a first distance between the solar cell array region and a portion of the frame along the other edge of the solar cell module is greater than a second distance between the solar cell array region and a portion of the frame along the one edge of the solar cell module.

A solar cell module according to the present disclosure includes: a solar panel which has a solar cell array region in which a plurality of solar cells are disposed; and a frame surrounding a periphery of the solar panel, wherein the solar cell array region is formed in such a manner that a first distance between the solar cell array region and a portion of the frame along another edge of the solar cell module is greater than a second distance between the solar cell array region and a portion of the frame along one edge of the solar cell module, and a direction connecting the one edge and the other edge is substantially perpendicular to a direction of alignment of, among the plurality of solar cells, solar cells in a solar cell string in the solar cell array region.

Advantageous Effects

According to the present disclosure, a great amount of light which has passed through a solar cell module from a light-receiving side is caused to again enter the solar cell module from the back side.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Figure 1:
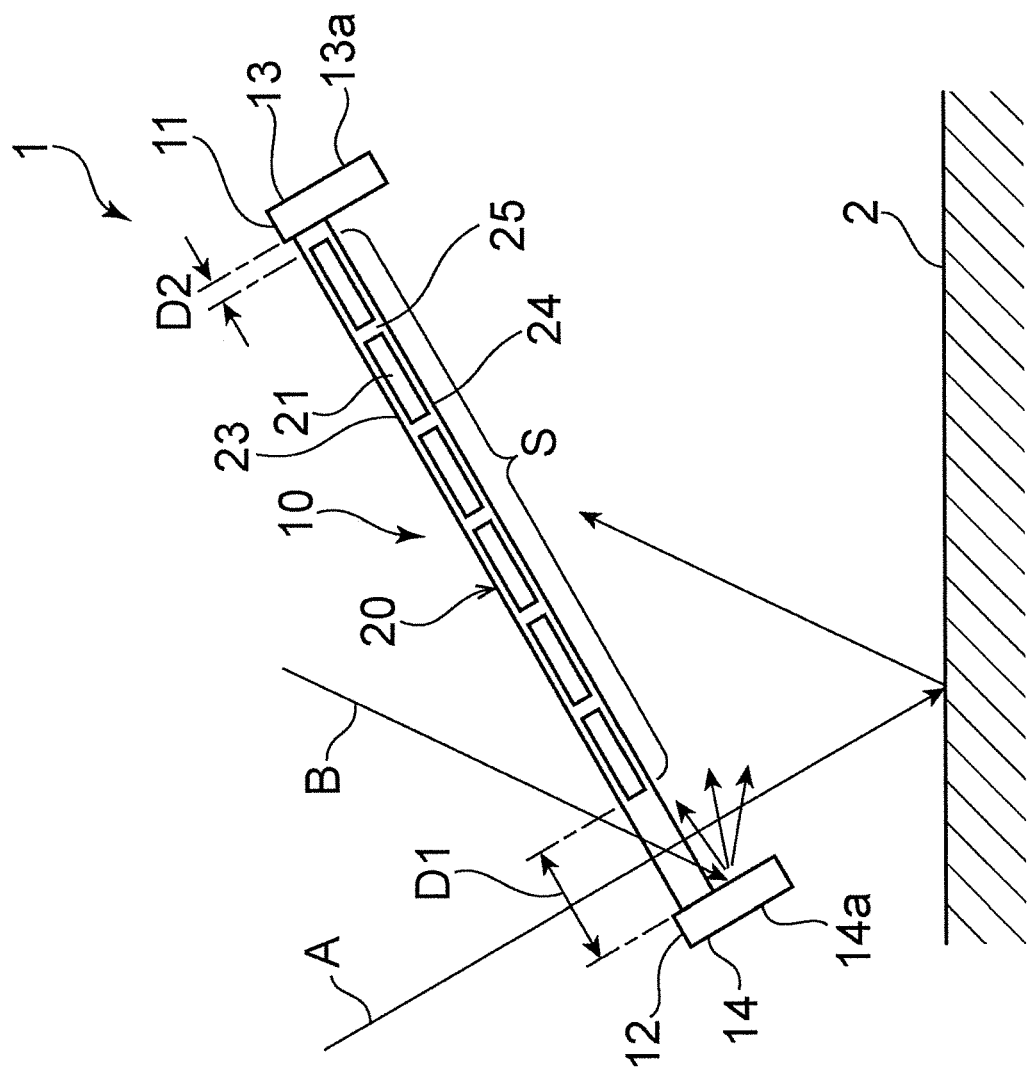
FIG. 1 is a schematic side view illustrating a solar cell system according to Embodiment 1.

The following describes particular embodiments. Note that the embodiments below are mere examples, and the present disclosure is not limited to the embodiments below. Furthermore, a member having substantially the same function may have the same reference sign in the drawings.

Embodiment 1

FIG. 1 is a schematic side view illustrating a solar cell system according to Embodiment 1. In a solar cell system 1 according to the present embodiment, a bifacial solar cell module 10 is installed tilted relative to a horizontal installation surface 2, with one edge 11 in an upper position where a great amount of light enters and another edge 12 in a lower position, as illustrated in FIG. 1. Specifically, the solar cell module 10 is installed in such a manner that an angle to the horizontal plane is about 10 to 45 degrees. Furthermore, the solar cell module 10 is installed in such a manner that the other edge 12 of the solar cell module 10 is at a height of about 30 cm to 150 cm from the installation surface 2. Note that support members, which are not illustrated in the drawings, support the one edge 11 and the other edge 12 so that the solar cell module 10 is installed on the installation surface 2.

Figure 2:
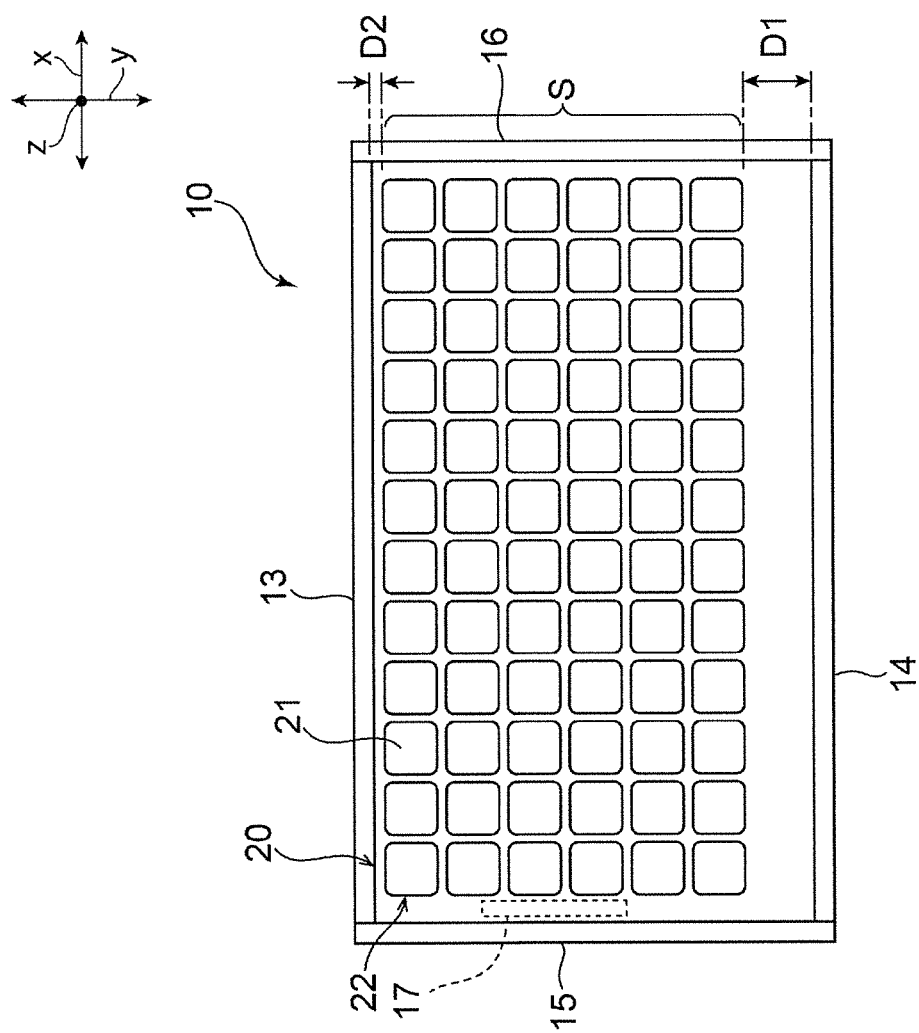
FIG. 2 is a plan view illustrating a solar cell module for use in the solar cell system according to Embodiment 1.

FIG. 2 is a plan view illustrating the solar cell module for use in the solar cell system according to Embodiment 1. As illustrated in FIG. 2, the solar cell module 10 includes a solar panel 20 which has a solar cell array region S in which a plurality of solar cells 21 are disposed, and a frame which includes portions 13, 14, 15, and 16 surrounding the periphery of the solar panel 20. As illustrated in FIG. 1, the portion 13 of the frame is located at the one edge 11, and the portion 14 of the frame is located at the other edge 12. Among the plurality of solar cells 21, adjacent solar cells 21 disposed in the x direction are electrically connected to one another by line members (not illustrated), thus forming solar cell strings 22. The solar cell strings 22 disposed in the y direction are electrically connected to one another by connecting lines (not illustrated).

A terminal box 17 is included between the portion 15 of the frame and the solar cell array region S. Note that the terminal box 17 may be included between the solar cell array region S and an edge other than the other edge 12 of the solar cell module 10, or in other words, between the solar cell array region S and a portion other than the portion 14 of the frame in a lower position. Output lines (not illustrated) from the solar cell strings 22 are connected to external connection cables (not illustrated) in the terminal box 17.

In the present embodiment, a direction (y direction) connecting the one edge 11 and the other edge 12 of the solar cell module 10 is substantially perpendicular to the direction (x direction) of alignment of the solar cells 21 in the solar cell strings 22 in the solar cell array region S.

As illustrated in FIG. 1, the solar panel 20 includes a light-receiving side transparent protective member 23, and a back side transparent protective member 24. The solar cells 21 are disposed between the light-receiving side transparent protective member 23 and the back side transparent protective member 24, and sealed in a filler layer 25. A transparent substrate such as a glass plate, an acrylic plate, or a polycarbonate plate is used as the light-receiving side transparent protective member 23. A glass plate, an acrylic plate, a polycarbonate plate, a transparent resin sheet, or a transparent resin film, for instance, is used as the back side transparent protective member 24. The filler layer 25 may be formed of, for instance, crosslinking resin such as an ethylene-vinyl acetate copolymer (EVA) or non-crosslinking resin such as polyolefin.

As illustrated in FIGS. 1 and 2, the solar cell array region S is formed in such a manner that a first distance D1 between the solar cell array region S and the portion 14 of the frame along the other edge 12 of the solar cell module 10 is greater than a second distance D2 between the solar cell array region S and the portion 13 of the frame along the one edge 11 of the solar cell module 10. The first distance D1 may be 3 times or more the second distance D2, or more specifically, 7 times or more. The first distance D1 may be shorter than the length of one side of the solar cell 21. The second distance D2 may be about ⅛ to 1/16 of the length of one side of the solar cell 21.

In the present embodiment, the solar cell array region S is formed in such a manner that the first distance D1 is greater than the second distance D2. Accordingly, as shown by light A illustrated in FIG. 1, light enters the solar cell module 10 from the light-receiving side which is the main surface where light enters, passes through the first distance D1, and is reflected off the installation surface 2. Consequently, light which again enters the solar cell module 10 from the back side increases.

In the present embodiment, the solar cell module 10 includes a reinforcement 14a extending substantially perpendicularly to the solar panel 20 from the portion 14 of the frame toward the installation surface 2, and a reinforcement 13a extending substantially perpendicularly to the solar panel 20 from the portion 13 of the frame toward the installation surface 2. Since the solar cell module 10 includes the reinforcement 14a, light which has passed through the first distance D1 is reflected off the reinforcement 14a, and is caused to again enter the solar cell module 10 from the back side, as shown by light B illustrated in FIG. 1. From the viewpoint of achieving a high reflectance, the surface of the reinforcement 14a may be silver or white.

In the present embodiment, the portion 14 of the frame and the reinforcement 14a are integrally formed, and the portion 13 of the frame and the reinforcement 13a are integrally formed. Note that reinforcements are formed also at the portions 15 and 16 of the frame in the present embodiment. The portions 13 to 16 of the frame and the reinforcements of the portions can be formed of metal such as stainless steel or aluminum or resin, for example. If the portions 13 to 16 of the frame and the reinforcements are formed of resin, a coating, for instance, may be applied to the surface to make the surface silver or white, as described above.

Embodiment 2

Figure 3:
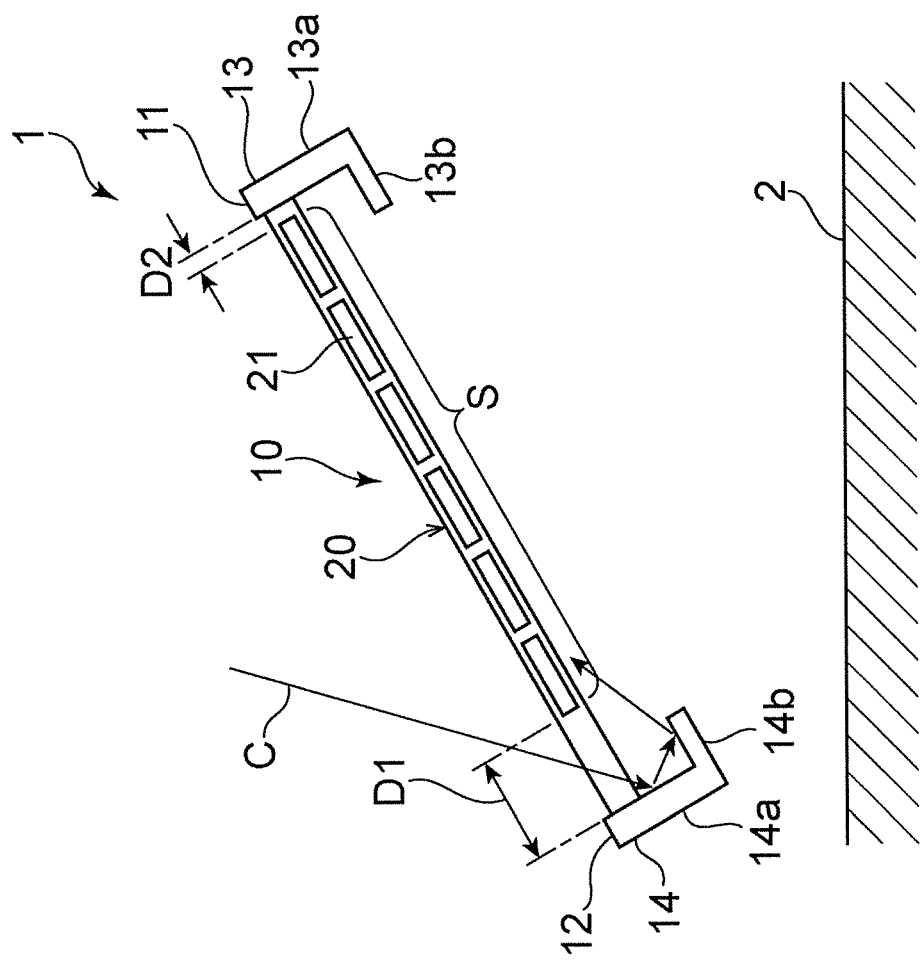
FIG. 3 is a schematic side view illustrating a solar cell system according to Embodiment 2.

FIG. 3 is a schematic side view illustrating a solar cell system according to Embodiment 2. In the present embodiment, the solar cell module 10 includes a flange 14b extending substantially parallel to the solar panel 20 from the reinforcement 14a toward the center of the solar panel 20, and a flange 13b extending substantially parallel to the solar panel 20 from the reinforcement 13a toward the center of the solar panel 20. The reinforcement 14a and the flange 14b extend about 10 mm to 30 mm, and a configuration may be adopted in which the solar cell module 10 is placed on the installation surface 2 by support members using the reinforcement 14a and the flange 14b. The other configuration is the same as that of Embodiment 1.

In the present embodiment, light which has passed through the first distance D1 is reflected off the flange 14b, and caused to again enter the solar cell module 10 from the back side, as shown by light C illustrated in FIG. 3. From the viewpoint of achieving a high reflectance, the surface of the flange 14b may be silver or white.

The flanges 13b and 14b may be integrally formed with the reinforcements 13a and 14a, respectively, or the reinforcements 13a and 14a may be members separate from and attached to the flanges 13b and 14b. The flanges 13b and 14b can be formed of metal such as stainless steel or aluminum or resin, for example. If the flanges 13b and 14b are formed of resin, a coating, for instance, may be applied to the surface to make the surface silver or white, as described above.

As described above, in the above embodiments, the first distance D1 is extended, and light which has passed through the extended first distance D1 is caused to again enter the solar cell module 10 from the back side, thus increasing the amount of power generated by the bifacial solar cell module 10.

Note that in the above embodiments, the portions 13, 14, 15, and 16 of the frame are attached to the periphery of the solar panel 20, and the solar cell module 10 is fixed and thereafter installed on the installation surface 2 using the support members, yet the configuration according to the present disclosure is not limited to this. For example, a frame which serves as a member that supports the solar panel 20 may be used to install the solar cell module 10 on the installation surface 2. Other than this, changes may be made as appropriate within the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The invention claimed is:

1. A solar cell system comprising
a bifacial solar cell module which is to be installed tilted relative to a horizontal plane with one edge in an upper position and another edge in a lower position, the solar cell module including:
 a solar panel which has a solar cell array region in which a plurality of solar cells are disposed; and
 a frame surrounding a periphery of the solar panel, wherein
the solar cell array region is formed in such a manner that a first distance between the solar cell array region and a portion of the frame along the other edge of the solar cell module is greater than a second distance between the solar cell array region and a portion of the frame along the one edge of the solar cell module,
wherein the frame comprises:
 a reinforcement extending substantially perpendicularly to the solar panel from the frame toward the horizontal plane; and
 a flange extending substantially parallel to the solar panel from an edge portion of the reinforcement on a horizontal plane side toward a center of the solar panel, wherein the flange comprises a reflective surface that reflects light passed through the first distance to the reflective surface and thereby causes the reflected light to enter the solar cell array region.

2. The solar cell system according to claim 1, wherein the reinforcement has a silver or white surface.

3. The solar cell system according to claim 1, wherein the flange has a silver or white surface.

4. The solar cell system according to claim 1, further comprising
 a support member that supports the bifacial solar cell module such that the bifacial solar cell module is installed on an installation surface with use of the reinforcement and the flange.

5. The solar cell system according to claim 1, wherein the reinforcement or the flange has a surface at least a portion of which is silver or white.

6. The solar cell system according to claim 1, wherein the first distance is 3 or more times the second distance.

7. The solar cell system according to claim 1, wherein the first distance is 7 or more times the second distance.

8. The solar cell system according to claim 1, wherein the reflective surface of the flange is provided at a position where the light reflected by the reflective surface directly enters a lower surface of the solar cell array region.

9. A solar cell module comprising:
a solar panel which has a solar cell array region in which a plurality of solar cells are disposed; and
a frame surrounding a periphery of the solar panel, wherein
the solar cell array region is formed in such a manner that a first distance between the solar cell array region and a portion of the frame along another edge of the solar cell module is greater than a second distance between the solar cell array region and a portion of the frame along one edge of the solar cell module, and
a direction connecting the one edge and the other edge is substantially perpendicular to a direction of alignment of, among the plurality of solar cells, solar cells in a solar cell string in the solar cell array region,
wherein the frame comprises:
 a reinforcement extending substantially perpendicularly to the solar panel from the frame toward the horizontal plane; and
 a flange extending substantially parallel to the solar panel from an edge portion of the reinforcement on a horizontal plane side toward a center of the solar panel, wherein the flange comprises a reflective surface that reflects light passed through the first distance to the reflective surface and thereby causes the reflected light to enter the solar cell array region.

10. The solar cell module according to claim 9, further comprising
 a support member that supports the solar cell module such that the solar cell module is installed on an installation surface with use of the reinforcement and the flange.

11. The solar cell module according to claim 9, wherein the reinforcement or the flange has a surface at least a portion of which is silver or white.

12. The solar cell module according to claim 9, wherein the first distance is 3 or more times the second distance.

13. The solar cell module according to claim 9, wherein the first distance is 7 or more times the second distance.

14. The solar cell module according to claim 9, wherein the reflective surface of the flange is provided at a position where the light reflected by the reflective surface directly enters a lower surface of the solar cell array region.

* * * * *